(12) United States Patent
Meyer et al.

(10) Patent No.: US 7,716,613 B2
(45) Date of Patent: May 11, 2010

(54) METHOD FOR CLASSIFYING ERRORS IN THE LAYOUT OF A SEMICONDUCTOR CIRCUIT

(75) Inventors: Dirk Meyer, Saffron Walden (GB); Thomas Roessler, München (DE)

(73) Assignee: Qimonda AG, Munich (DE)

( * ) Notice: Subject to any disclaimer, the term of this patent is extended or adjusted under 35 U.S.C. 154(b) by 516 days.

(21) Appl. No.: 11/712,635

(22) Filed: Mar. 1, 2007

(65) Prior Publication Data

US 2007/0157142 A1 Jul. 5, 2007

Related U.S. Application Data

(62) Division of application No. 10/447,386, filed on May 29, 2003, now Pat. No. 7,207,016.

(30) Foreign Application Priority Data

May 29, 2002 (DE) ................................ 102 24 417

(51) Int. Cl.
G06F 17/50 (2006.01)
(52) U.S. Cl. ............................................. 716/4; 716/5
(58) Field of Classification Search ................. 716/4–5
See application file for complete search history.

(56) References Cited

U.S. PATENT DOCUMENTS

| 5,062,054 | A | 10/1991 | Kawakami et al. |
| 5,787,006 | A | 7/1998 | Chevallier et al. |
| 6,011,911 | A | 1/2000 | Ho et al. |
| 6,063,132 | A | 5/2000 | DeCamp et al. |
| 6,078,737 | A | 6/2000 | Suzuki |
| 6,397,373 | B1 | 5/2002 | Tseng et al. |
| 6,418,551 | B1 | 7/2002 | McKay et al. |
| 6,769,103 | B2 * | 7/2004 | Chevallier et al. ............... 716/5 |
| 6,816,997 | B2 | 11/2004 | Teh et al. |
| 2003/0018943 | A1 | 1/2003 | Akutagawa et al. |
| 2003/0061583 | A1 | 3/2003 | Malhotra |

* cited by examiner

*Primary Examiner*—Vuthe Siek
(74) *Attorney, Agent, or Firm*—Dicke, Billig & Czaja, PLLC

(57) ABSTRACT

A method for classifying errors in the layout of a semiconductor circuit includes examining the layout of the semiconductor circuit for infringement of predetermined design rules in order to establish errors. For each error, the error is marked in the layout, and information about the error and the layout of the semiconductor circuit in an area surrounding the error is extracted. The extracted information is compared with pre-stored information within a multiplicity of classes, and the error is assigned to the respective class on the basis of the compared information.

18 Claims, 2 Drawing Sheets

Pattern 1

Pattern 2

METHOD FOR CLASSIFYING ERRORS IN THE LAYOUT OF A SEMICONDUCTOR CIRCUIT

CROSS-REFERENCE TO RELATED APPLICATIONS

This application is a division of U.S. application Ser. No. 10/447,386 filed May 29, 2003; the application also claims the priority, under 35 U.S.C. §119, of German patent application DE 102 24 417.0, filed May 29, 2002; the prior applications are herewith incorporated by reference in their entirety.

BACKGROUND OF THE INVENTION

Field of the Invention

Known physical verification software checks the physical semiconductor circuit design for adherence to defined design rules that are intended, by way of example, to guarantee the manufacturability and operability of the circuit on silicon. For every transgression of a design rule, the software generates an error message that indicates which rule has been transgressed at which point in the circuit. To clarify the transgression, an "error marker" is also produced. The error marker can have various forms.

If, by way of example, a minimum distance between the edges of two polygons has been transgressed, then either the two edges could be indicated or a polygon covering the area between the two edges.

The manufacturers of verification software take the following model of use as a basis: if a design rule has been transgressed, then this is found by the user on the basis of the error message, is considered and is finally corrected.

In practical use, however, many design-rule transgressions are classified by the user as being "irrelevant", "noncritical" or "acceptable in this instance" and are not corrected. The user thus supplies additional knowledge, such as experience relating to the manufacturability of a structure on silicon despite the formal transgression of the design rule.

The number of errors which are accepted in this manner can run into thousands in repetitive structures such as arise on memory chips, for example.

The problem that arises is thus that of finding among several thousand accepted errors those errors that should not be accepted. However, the error messages exist in unspecified assortment for a design rule transgression and within a cell (large IC designs are divided into a hierarchy of cells) and contain no objectifiable order features.

SUMMARY OF THE INVENTION

It is accordingly an object of the invention to provide a method for classifying errors in the layout of a semiconductor circuit that overcome the above-mentioned disadvantages of the prior art methods and devices of this general type. In particular, the intention is to allow acceptable errors to be distinguished from those that should not be accepted.

With the foregoing and other objects in view there is provided, in accordance with the invention, a method for classifying errors in a layout of a semiconductor circuit. The method includes examining the layout of the semiconductor circuit for infringement of predetermined design rules for establishing errors, marking each error in the layout, extracting information about the error and about the layout of the semiconductor circuit in an area surrounding the error resulting in extracted information, comparing the extracted information with prestored information within a multiplicity of classes resulting in compared information, and assigning the error to a respective class on a basis of the compared information.

In particular, the method involves every error being marked and then information about the error marking and the area of layout surrounding the error being stored in the form of a geometrical pattern in a memory. The pattern is then compared with already stored patterns to ascertain geometrical identity.

The advantage of this method is, in particular, that design rule check (DRC) error markers together with their surrounding area can be efficiently compared on an exact geometrical basis with other DRC error markers and their surrounding area and can thus be classified.

The area surrounding an error marking contains geometrical objects on one or more reference levels. Every such reference level shows information relating to various aspects of the layout, such as geometrical aspects, or else an association between geometrical information and a physical layer in the semiconductor circuit that is to be manufactured.

To identify errors, information from various reference levels can be used. By way of example, the design rule check can relate to the adherence to a minimum distance between elements in various layers of the semiconductor circuit, these being shown in various reference levels.

Which reference levels are used for checking the design rules depends on the semantics of the check. Which parts of geometrical objects within a level are included in a pattern is determined using a set of rules that is specific to a design rule check and to the respective reference level and describes the region under consideration.

For classification purposes, errors are assigned to the same error class whenever their pattern is identical to the reference pattern for the error class. To this end, a pattern library is used. If a pattern is not found in the pattern library, then it is a new pattern, which is indicated to the user and is added to the pattern library for further comparisons.

If a pattern to be classified is found in the pattern library by a comparison operation, then it has already been identified and does not need to be handled further.

In addition, every classification can involve the location of the occurrence of a pattern together with its error class being stored in a database, so that not just the first occurrence but all instances of an error class are signaled to the user.

The pattern comparison is particularly efficient in terms of runtime when the pattern data are normalized. In this context, the type of normalization depends on the nature of the geometrical objects that are to be normalized (e.g. edges, polygons, error markings).

In addition, the order of geometrical objects associated with the same reference level is normalized.

In order to obtain an explicit representation for all patterns as well, the normalized error markings and reference levels are disposed in the layout and compared for all patterns in the order of the reference levels.

The normalization of the geometrical objects, of the order of geometrical objects within the individual reference levels and of the order of the reference levels considerably simplifies classification of the extracted patterns, since the information about the patterns to be classified is therefore organized on a standard basis (i.e. in the same way for all patterns). The patterns can therefore be classified by simple geometrical comparison operations.

The invention also provides a data processing installation for designing the layout of a semiconductor circuit, where the data processing installation is designed for processing layout data for examining the layout design for errors, for extracting a data record which contains information about an error and the layout of the semiconductor circuit in an area surrounding the error, for comparing the information in the extracted data record with prestored information within a multiplicity of classes, and for storing the data record in a memory area associated with the respective class on the basis of the comparison.

In accordance with an added mode of the invention, there is the step of forming the extracted information about the error and the layout of the semiconductor circuit in the area surrounding the error to be geometrical and electrical information. The information may represent the error and the layout of the semiconductor circuit in the area surrounding the error as a geometrical pattern, and the prestored information in each of the classes represents a different geometrical pattern. A comparison of the information involves the geometrical patterns being compared for geometrical identity. The geometrical pattern may contain a number of geometrical objects.

In accordance with another mode of the invention, there is the step of normalizing the geometrical pattern according to predetermined rules before performing a comparison resulting in a normalized pattern. Normalizing a configuration of the geometrical objects in the geometrical pattern before the comparison may also be done. Furthermore, normalizing all of the geometrical objects in the geometrical pattern with respect to a standard zero point in a predetermined coordinate system, is preferred. In addition there is a preference to normalize a representation of the geometrical objects in the geometrical pattern before a comparison is performed In accordance with a further mode of the invention, there is the step of representing each of the geometrical objects by a multiplicity of coordinates that are organized according to criteria which are standard for all geometrical objects while maintaining a topology.

In accordance with an additional mode of the invention, there is the step of assigning the normalized pattern a discrete number using a hash function, and using a hashing algorithm for performing a comparison using the hash function.

In accordance with a further added mode of the invention, there is the step of representing the layout in a plurality of information levels, and the information about the layout in the area surrounding the error is associated with at least one of the information levels.

In accordance with a further additional mode of the invention, there is the step of normalizing an order of the geometrical objects within each information level before performing a comparison. Preferably an order of the information levels are normalized before performing the comparison.

In accordance with another further mode of the invention, there is the step of extracting only the information about the layout in the area surrounding the error that satisfies predetermined criteria. The extracted information is stored in a new class if the extracted information does not match the prestored information in any of the multiplicity of classes. The information about a location of the error in the layout and about an associated class is stored when the error is assigned to a class.

In accordance with another mode of the invention, there is the step of defining the area surrounding the error as a rectangle on the layout. Preferably, the user defines a size of the rectangle.

In accordance with a concomitant mode of the invention, a comparison of the geometrical pattern takes into account all possible geometrical transformations used when designing the layout, resulting in that two compared identical patterns are identified as being identical regardless of possible application of one of the transformations to one of the patterns.

Other features which are considered as characteristic for the invention are set forth in the appended claims.

Although the invention is illustrated and described herein as embodied in a method for classifying errors in the layout of a semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

By way of example, the design rules in a production process for integrated circuits prescribe that an overlap between two levels must not be below a prescribed minimum value. A physical verification system (e.g. "Assura" from the company Cadence Design Systems, Inc.) is used to identify transgressions of the rule.

Figure 1:
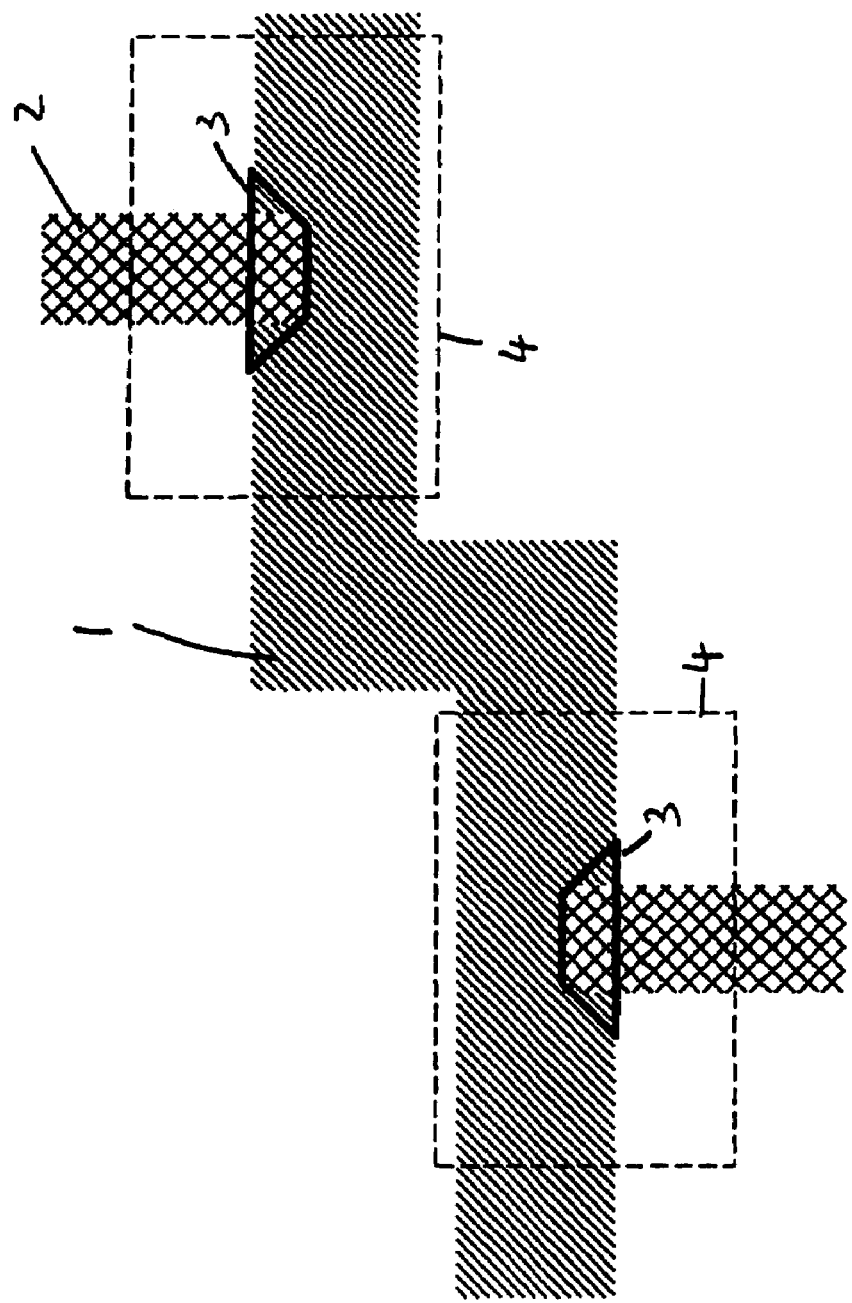
FIG. 1 is a diagrammatic, plan view of a detail of a layout for a semiconductor circuit.
Figure 2A:
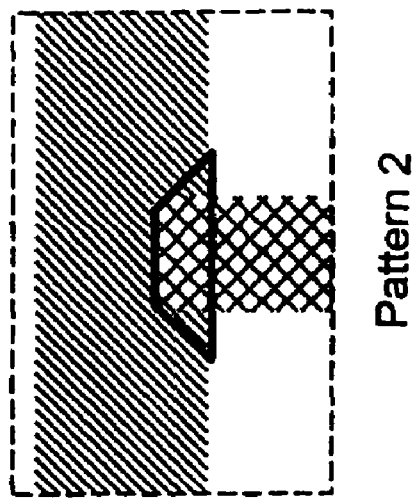
FIGS. 2A and 2B are plan views of patterns extracted from the semiconductor circuit.
Figure 2B:
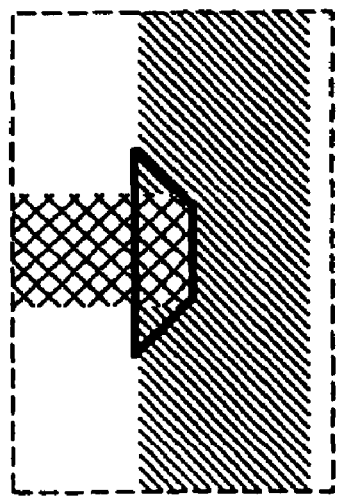

Referring now to the figures of the drawing in detail and first, particularly, to FIGS. 1, 2A, and 2B thereof, there is shown two transgressions of a minimum overlap between two levels 1 and 2. The levels 1 and 2 are represented by different patterns. The transgressions are indicated to the user of the verification system geometrically by trapezoidal error markers 3.

The area surrounding an error marker generally contains the corresponding details from a plurality of levels. The details are determined on a level-by-level basis by the size of a rectangle 4 that surrounds the error marker. The size of the rectangle can be prescribed by the user.

The error markers 3 and parts of the layout of other levels that are situated within the rectangle 4 are combined to form a pattern (FIGS. 2A and 2*b*).

The geometry of the error markers 3 and of the level-by-level details contains, by way of example, polygons or edge objects whose coordinates are indicated in a discrete two-dimensional coordinate system.

The patterns are normalized in the now described steps.

a). The geometrical data for the level-by-level details are combined ("merging") into the largest possible polygons and edges using geometrical algorithms. Therefore, by way of example, the edge pieces that are situated on a common straight line and touch or overlap are combined into one edge. For polygon objects, it is advantageous to choose, in this regard, a data structure in which a polygon contains an outer contour and a number of holes within the outer contour. This avoids unambiguity problems that can arise, by way of example, when describing polygons with holes using a single continuous contour. Otherwise, this can result in identical patterns being identified differently from the point of view of a user.

b). Without changing the relative configuration of objects of the pattern, the objects are shifted such that the bottom left-hand corner of the surrounding rectangle for all objects of a pattern is situated at the zero point of the coordinate system of the pattern.

c). The representation of the individual objects is normalized. By way of example, a polygon whose contour is defined by different coordinates can be normalized by choosing the lexicographically smallest point as the starting point of the contour, the order of the points being maintained among one another (predecessor/successor relationships) and hence the direction of rotation of the contour being maintained.

d). The order of objects of each pattern is normalized on a level-by-level basis. A set of normalized polygons which neither touch nor overlap can be put into an explicit order, for example by sorting by use of a lexicographical comparison of the starting points of the normalized outer contours.

e). A pattern is normalized by disposing the normalized levels in an explicit order.

In normalized form, the patterns can be checked for geometrical identity by simple comparison operations.

In order to signal just the respective first occurrence of a pattern to the user of a physical verification system, a pattern library is created. Identical patterns can then be found by searching in the pattern library.

Since current layout surroundings use only a limited number of (cell) transformations, it is recommended that the patterns be stored either in all possible transformations in the pattern library or that all possible transformations of a pattern be compared with the patterns in the pattern library. If, by way of example, rotations through multiples of 90 degrees and reflections with respect to the coordinate axes are permitted, then a total of eight possible transformations are obtained.

In this way, the patterns 1 and 2 from FIGS. 2A and 2B are identified as being identical.

The runtime of the comparison can be reduced by assigning every normalized pattern a discrete number using a "hash" function. A hashing algorithm then uses the hash function in order to compare only patterns with the same hash function value with one another.

Alternative data structures that permit efficient comparison of patterns with classes can be used. Thus, the classes can be disposed and compared in a binary search tree, e.g. an AVL tree.

Using an implementation of the method described, the following number of classes has been determined for a DRAM layout:

| Type of check | Number of errors signaled (hierarchically) | Number of error classes (hierarchically) |
|---|---|---|
| Two-layer overlap check | 473216 | 76 |
| Two-layer distance check | 335744 | 33 |

Figure 3:
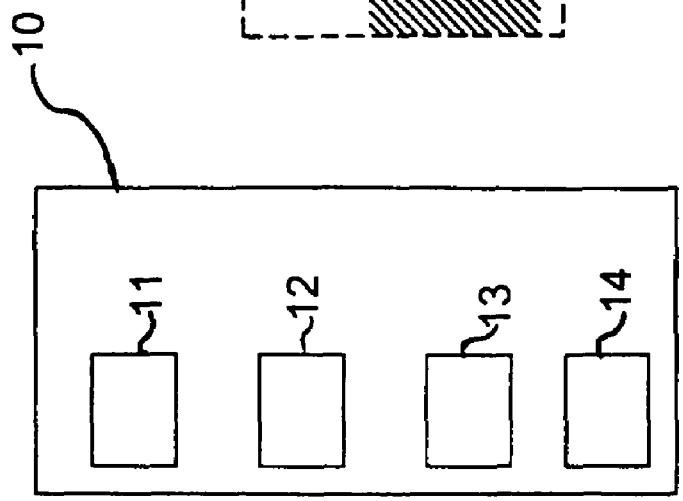
FIG. 3 is a diagrammatic illustration of a data processing installation for executing computer code.

FIG. 3 shows a data processing installation 10 for designing the layout of the semiconductor circuit. The data processing installation 10 contains: first means 11 for processing layout data for examining the layout for errors; second means 12 for extracting a data record containing information about an error and the layout of the semiconductor circuit in an area surrounding the error resulting in an extracted data record; third means 13 for comparing 13 the information in the extracted data record with prestored information within a multiplicity of classes; and fourth means 14 for storing the extracted data record in a memory area associated with a respective class on a basis of a comparison.

It should be noted that the invention is not limited to the exemplary embodiment described, but rather contains modifications within the scope of protection defined by the claims.

I claim:

1. A method for classifying errors in a layout of a semiconductor circuit, which comprises the steps of:
examining, via a data processing installation, the layout of the semiconductor circuit for infringement of predetermined design rules for establishing errors;
marking, via the data processing installation, each error in the layout;
extracting, via the data processing installation, information about the error and about the layout of the semiconductor circuit in an area surrounding the error resulting in extracted information;
comparing, via the data processing installation, the extracted information with prestored information within a multiplicity of classes resulting in compared information, the comparing step including considering at least one transformation of the extracted information; and
assigning, via the data processing installation, the error to a respective class on a basis of the compared information,
wherein the extracted information represents the error and the layout of the semiconductor circuit in the area surrounding the error as a geometric pattern,
wherein the transformation includes at least one of a rotation, a mirroring, and a normalizing of the extracted information; and
wherein the comparing step includes: comparing the geometrical pattern with the prestored information within the multiplicity of classes resulting in the compared information, the prestored information in each of the classes representing a different geometrical pattern being compared with at least one transformation of the geometrical pattern of the extracted information for geometrical identity.

2. The method according to claim 1, which further comprises forming, via the data processing installation, the extracted information about the error and the layout of the semiconductor circuit in the area surrounding the error to be geometrical and electrical information.

3. The method according to claim 1, wherein the geometrical pattern contains a number of geometrical objects.

4. The method according to claim 3, which further comprises representing, via the data processing installation, the layout in a plurality of information levels, and the information about the layout in the area surrounding the error is associated with at least one of the information levels.

5. The method according to claim 1, which further comprises extracting, via the data processing installation, only the information about the layout in the area surrounding the error that satisfies predetermined criteria.

6. The method according to claim 1, which further comprises storing, via the data processing installation, the extracted information in a new class if the extracted information does not match the prestored information in any of the multiplicity of classes.

7. The method according to claim 1, which further comprises storing, via the data processing installation, the information about a location of the error in the layout and about an associated class when the error is assigned to a class.

8. The method according to claim 1, which further comprises defining, via the data processing installation, the area surrounding the error as a rectangle on the layout.

9. The method according to claim 8, which further comprises user-defining, via the data processing installation, a size of the rectangle.

10. A computer-readable storage device, comprising computer executable instructions for carrying out the method according to claim 1.

11. A method for classifying errors in a layout of a semiconductor circuit, which comprises the steps of:
examining, via a data processing installation, the layout of the semiconductor circuit for infringement of predetermined design rules for establishing errors;
marking, via the data processing installation, each error in the layout;
extracting, via the data processing installation, information about the error and about the layout of the semiconductor circuit in an area surrounding the error resulting in extracted information;
comparing, via the data processing installation, the extracted information with prestored information within a multiplicity of classes resulting in compared information, the comparing step including considering at least one transformation of the extracted information; and
assigning, via the data processing installation, the error to a respective class on a basis of the compared information,
wherein the extracted information represents the error and the layout of the semiconductor circuit in the area surrounding the error as a geometric pattern,
wherein the transformation includes at least one of a rotation, a mirroring, and a normalizing of the extracted information,
wherein the geometrical pattern contains a number of geometrical objects, and
which further comprises normalizing, via the data processing installation, a configuration of the geometrical objects in the geometrical pattern before performing the comparing step.

12. The method according to claim 11, which further comprises normalizing, via the data processing installation, all the geometrical objects in the geometrical pattern with respect to a standard zero point in a predetermined coordinate system.

13. A method for classifying errors in a layout of a semiconductor circuit, which comprises the steps of:
examining, via a data processing installation, the layout of the semiconductor circuit for infringement of predetermined design rules for establishing errors;
marking, via the data processing installation, each error in the layout;
extracting, via the data processing installation, information about the error and about the layout of the semiconductor circuit in an area surrounding the error resulting in extracted information;
comparing, via the data processing installation, the extracted information with prestored information within a multiplicity of classes resulting in compared information, the comparing step including considering at least one transformation of the extracted information; and
assigning, via the data processing installation, the error to a respective class on a basis of the compared information,
wherein the extracted information represents the error and the layout of the semiconductor circuit in the area surrounding the error as a geometric pattern,
wherein the transformation includes at least one of a rotation, a mirroring, and a normalizing of the extracted information,
wherein the geometrical pattern contains a number of geometrical objects, and
which further comprises normalizing, via the data processing installation, a representation of the geometrical objects in the geometrical pattern before the comparing step is performed resulting in a normalized pattern.

14. The method according to claim 13, which further comprises representing, via the data processing installation, each of the geometrical objects by a multiplicity of coordinates which are organized according to criteria which are standard for all of the geometrical objects while maintaining a topology of the layout.

15. The method according to claim 13, which further comprises assigning, via the data processing installation, to the normalized pattern a discrete number using a hash function, and using a hashing algorithm for performing the comparing step using the hash function.

16. A method for classifying errors in a layout of a semiconductor circuit, which comprises the steps of:
examining, via a data processing installation, the layout of the semiconductor circuit for infringement of predetermined design rules for establishing errors;
marking, via the data processing installation, each error in the layout;
extracting, via the data processing installation, information about the error and about the layout of the semiconductor circuit in an area surrounding the error resulting in extracted information;
comparing, via the data processing installation, the extracted information with prestored information within a multiplicity of classes resulting in compared information, the comparing step including considering at least one transformation of the extracted information; and
assigning, via the data processing installation, the error to a respective class on a basis of the compared information,
wherein the extracted information represents the error and the layout of the semiconductor circuit in the area surrounding the error as a geometric pattern,
wherein the transformation includes at least one of a rotation, a mirroring, and a normalizing of the extracted information,
wherein the geometrical pattern contains a number of geometrical objects,
which further comprises representing, via the data processing installation, the layout in a plurality of information levels, and the information about the layout in the area surrounding the error is associated with at least one of the information levels, and
which further comprises normalizing, via the data processing installation, an order of the geometrical objects within each information level before performing the comparing step.

17. The method according to claim 16, which further comprises normalizing, via the data processing installation, an order of the information levels before performing the comparing step.

18. A method for classifying errors in a layout of a semiconductor circuit, which comprises the steps of:

examining, via a data processing installation, the layout of the semiconductor circuit for infringement of predetermined design rules for establishing errors;

marking, via the data processing installation, each error in the layout;

extracting, via the data processing installation, information about the error and about the layout of the semiconductor circuit in an area surrounding the error resulting in extracted information;

comparing, via the data processing installation, the extracted information with prestored information within a multiplicity of classes resulting in compared information, the comparing step including considering at least one transformation of the extracted information; and assigning, via the data processing installation, the error to a respective class on a basis of the compared information, wherein the extracted information represents the error and the layout of the semiconductor circuit in the area surrounding the error as a geometric pattern, wherein the transformation includes at least one of a rotation, a mirroring, and a normalizing of the extracted information, and wherein a comparison of the geometrical pattern takes into account all possible geometrical transformations used when designing the layout, resulting in that two compared identical patterns are identified as being identical regardless of possible application of one of the transformations to one of the patterns.

\* \* \* \* \*